(12) United States Patent
Liu et al.

(10) Patent No.: US 8,691,636 B2
(45) Date of Patent: Apr. 8, 2014

(54) METHOD FOR REMOVING GERMANIUM SUBOXIDE

(75) Inventors: Po-Tsun Liu, Hsinchu (TW); Chen-Shuo Huang, Kaohsiung (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 13/590,090

(22) Filed: Aug. 20, 2012

(65) Prior Publication Data
US 2013/0171830 A1 Jul. 4, 2013

(30) Foreign Application Priority Data
Jan. 3, 2012 (TW) .............................. 101100190 A

(51) Int. Cl.
*H01L 21/335* (2006.01)
*H01L 21/8232* (2006.01)

(52) U.S. Cl.
USPC ........... 438/142; 438/197; 438/758; 438/765; 438/768; 423/1

(58) Field of Classification Search
None
See application file for complete search history.

(56) References Cited

U.S. PATENT DOCUMENTS

| | | | |
|---|---|---|---|
| 7,132,372 B2 | 11/2006 | Smith et al. | |
| 8,071,458 B1 * | 12/2011 | Liu et al. | 438/393 |
| 2007/0298536 A1 * | 12/2007 | Ren et al. | 438/102 |
| 2008/0081388 A1 * | 4/2008 | Yasseri et al. | 438/22 |
| 2009/0057739 A1 | 3/2009 | Iwai et al. | |
| 2012/0128556 A1 * | 5/2012 | Rosenberg et al. | 423/25 |

OTHER PUBLICATIONS

C. Huang and P. Liu, "Effect of high-pressure $H_2O$ treatment on elimination of interfacial $GeO_x$ layer between $ZrO_2$ and Ge stack," Applied Physics Letters 99, 082907 (2011) (3 pgs.).

C. Huang and P. Liu, "Study of Thin Gate Dielectrics on Silicon and Germanium MOSFETs," Dissertation Submitted to Institute of Electro-Optical Engineering Department of Photonics, College of Electrical and Computer Engineering, National Chaio Tung University, Sep. 2011 (178 pgs.).

S. Rangan, et al., "$GeO_x$ interface layer reduction upon Al-gate deposition on a $HfO_2/Geo_x/Ge(001)$ stack," Applied Physics Letters 92, 172906 (2008) (3 pgs.).

X. Zou, et al., "Suppressed growth of unstable low-$k$ $GeO_x$ interlayer in Ge metal-oxide-semiconductor capacitor with high-$k$ gate dielectric by annealing in water vapor," Applied Physics Letters 90, 163502 (2007) (3 pgs.).

B. Xie, et al., "Native oxide removal from SiGe using mixtures of HF and water delivered by aqueous, gas, and supercritical $CO_2$ processes," Materials Science in Semiconductor Processing 8 (2005) 231-237 (7 pgs.).

* cited by examiner

*Primary Examiner* — Duy Deo
(74) *Attorney, Agent, or Firm* — DLA Piper LLP (US)

(57) ABSTRACT

A method for removing germanium suboxide between a germanium (Ge) substrate and a dielectric layer made of metal oxide includes causing a supercritical fluid composition that includes a supercritical carbon dioxide fluid and an oxidant to diffuse into the germanium suboxide such that metal residues in the dielectric layer, the germanium suboxide and the oxidant are subjected to a redox reaction so as to reduce the germanium suboxide into germanium.

11 Claims, 8 Drawing Sheets

Preparing a supercritical fluid composition consisting of a supercritical carbon dioxide (scCO$_2$) fluid, an oxidant and a solubilizer.

Causing the supercritical fluid composition to diffuse in germanium suboxide between a germanium substrate and a dielectric layer such that metals in the dielectric layer, the germanium suboxide, and the oxidant are subjected to a redox reaction so as to reduce the germanium suboxide into germanium.

FIG.1

METHOD FOR REMOVING GERMANIUM SUBOXIDE

CROSS-REFERENCE TO RELATED APPLICATION

This application claims priority of Taiwanese application no. 101100190, filed on Jan. 3, 2012.

BACKGROUND OF THE INVENTION

1. Field of the Invention

This invention relates to a method for removing germanium oxides, more particularly to a method for removing germanium suboxide ($GeO_x$, $x<2$) using a supercritical fluid composition.

2. Description of the Related Art

With the trends toward miniaturization and multi-functionality in electronic products, in the manufacturing techniques of integrated circuits (ICs), sizes of transistors have to be minimized to meet the demands for high performance and density. However, performance of a conventional MOSFET containing polysilicon/silicon dioxide/silicon channel is unlikely to be improved by virtue of mere miniaturization due to the limitations of carrier mobility of silicon substrate and capacitance of a gate dielectric layer. Thus, much research has been devoted to the development of a semiconductor substrate with high carrier mobility and of a high capacitance material for the gate dielectric layer.

In the research of promoting the carrier mobility of a semiconductor substrate, since the mobilities of electrons and electric holes of germanium (Ge) are respectively double and quadruple of those of silicon (Si) and since the manufacturing process for Ge is similar to that for silicon (Si), Ge-MOSFET is regarded as the semiconductor element having most potential in the future. Besides, in recent years, many kinds of dielectric materials that can be used in a gate dielectric layer of Ge-MOSFET to promote capacitance coupling ability have been developed, such as germanium dioxide ($GeO_2$), silicon dioxide ($SiO_2$), hafnium dioxide ($HfO_2$), zirconium dioxide ($ZrO_2$), and lanthanum oxide (LaO).

However, the aforesaid Ge-MOSFET is currently not widely used. One major reason is that germanium dioxide has inferior thermal stability compared to that of silicon dioxide ($SiO_2$). Accordingly, when depositing and forming on a Ge substrate a dielectric layer composed of a material having a high dielectric constant in a subsequent manufacturing process under a relatively high temperature (about 400° C.) or when conducting a subsequent thermal process (>500° C.), $GeO_2$ formed between the Ge substrate and the dielectric layer is likely to react with Ge of the Ge substrate to form germanium suboxide ($GeO_x$, $x<2$) having a relatively low dielectric constant, thereby resulting in increased gate leakage current and reduced capacitance coupling. Therefore, how to reduce and remove germanium suboxide to alleviate the gate leakage current is the subject of endeavor in the Ge-MOSFET.

Two procedures for removing $GeO_x$ are currently available:

(1) Pre-treatment of a Ge-substrate before depositing a dielectric layer so as to remove native oxides on the Ge-substrate. For example, a method for preparing a surface of a semiconductor substrate is disclosed in U.S. Pat. No. 7,132,372B2, in which native oxides on the Ge-substrate are removed using oxygen plasma and wet etching. U.S. Pat. No. 7,238,291B2 disclosed a method for removing $GeO_x$ using an etching solution containing hydrogen bromide (HBr) and hydrogen iodide (HI). Besides, B. Xie et al. disclosed a method for removing native oxides from SiGe using a mixture of HF and water delivered by supercritical $CO_2$ ($scCO_2$) (B. Xie, G Montano-Miranda, C. C. Finstad, and A. J. Muscat, "Native oxide removal from SiGe using mixture of HF and water delivered by aqueous, gas, and supercritical $CO_2$ process" Mater. Sci. Semicond. Process, vol. 8, pp. 231-237, 2005). In this literature, native oxide is removed by virtue of the etching property of HF. A mixture containing only water and scCO2, i.e., without HF, is unable to remove $GeO_2$. Moreover, although the conventional method disclosed in the prior art can remove the native oxides on the Ge-substrate, the $GeO_x$ formed in a subsequent thermal process, e.g., between the Ge substrate and a dielectric layer, is unable to be removed using the mixture of HF and water since the etchant, HF, is unlikely to penetrate into an interface between the substrate and the dielectric layer.

(2) Removal of $GeO_x$ after depositing a dielectric layer. X. Zou et al. proposed use of a wet-$N_2$ (water vapor/$N_2$) annealing process under a relatively high temperature (500° C.) to remove $GeO_x$ formed between a Ge-substrate and a gate dielectric layer (X. Zou, J. P. Xu, C. X. Li and P. T. Lai, "Suppressed growth of unstable low-k $GeO_x$ interlayer in Ge metal-oxide-semiconductor capacitor with high-k gate dielectric by annealing in water vapor", Appl. Phys. Lett., vol. 90, p. 163502, 2007). S. Rangan et al. proposed use of aluminum as a gate electrode that is deposited on a dielectric layer to draw the oxygen atom from $GeO_x$ to form aluminum oxide, thereby removing $GeO_x$ formed between a Ge-substrate and the dielectric layer (S. Rangan, E. Bersch, R. A. Bartynski, E. Garfunkel, and E. Vescovo, "GeOx interface layer reduction upon Al-gate deposition on a HfO2/GeOx/Ge (001) stake", Appl. Phys. Lett., vol. 92, p. 172906, 2008). However, the former method for removing $GeO_x$ using water vapor/$N_2$ at 500° C. requires a relatively high thermal budget, and the latter method for removing $GeO_x$ using aluminum has a disadvantage of lower capacitance coupling ability due to the formation of aluminum oxide having a relatively low dielectric constant.

Therefore, an effective method for removing $GeO_x$ to solve the problem of gate leakage current is still required in the Ge-MOSFET field.

SUMMARY OF THE INVENTION

Therefore, an object of the present invention is to provide a method for removing $GeO_x$ ($x<2$) using a supercritical fluid composition containing an oxidant for conducting a redox reaction.

Accordingly, this invention provides a method for removing germanium suboxide between a germanium (Ge) substrate and a dielectric layer made of metal oxide. The method includes causing a supercritical fluid composition that includes a supercritical carbon dioxide fluid and an oxidant to diffuse into the germanium suboxide such that metal residues in the dielectric layer, the germanium suboxide and the oxidant are subjected to a redox reaction so as to reduce the germanium suboxide into germanium.

BRIEF DESCRIPTION OF THE DRAWINGS

Other features and advantages of the present invention will become apparent in the following detailed description of the preferred embodiments of the invention, with reference to the accompanying drawings, in which:

FIG. 1 is a flow chart illustrating the preferred embodiment of a method for removing $GeO_x$ (x<2) according to this invention;

DETAILED DESCRIPTION OF THE PREFERRED EMBODIMENTS

Figure 2:
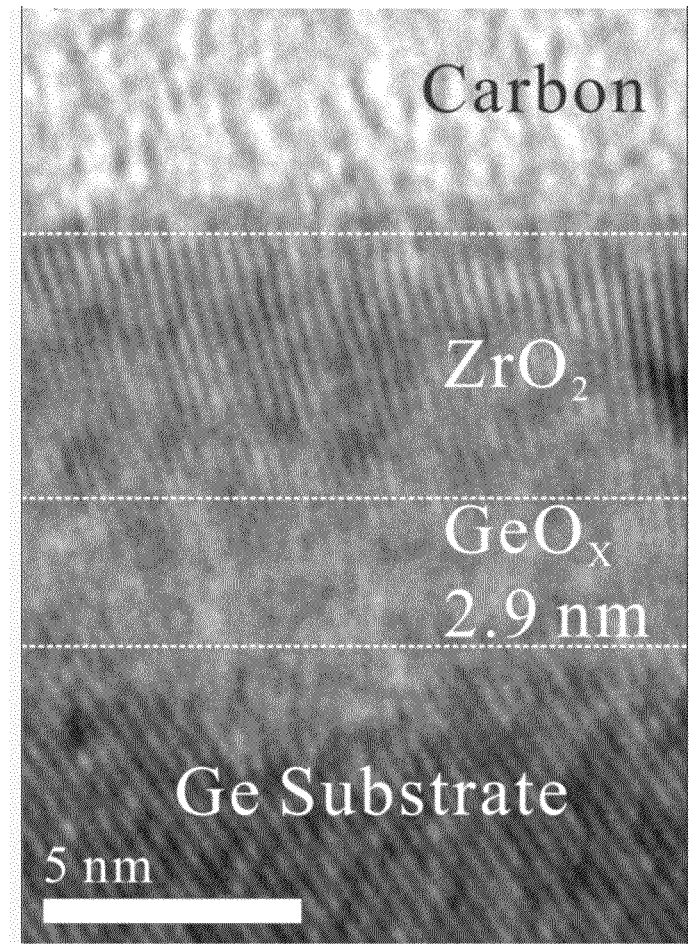
FIG. 2 is a TEM diagram showing a Ge semiconductor element to be processed by the method of the preferred embodiment.

The present invention provides a method for removing germanium suboxide ($GeO_x$, x<2) formed on a germanium (Ge) semiconductor element that includes a Ge substrate and a dielectric layer made of metal oxide. Specifically, the method of this invention is used to remove germanium suboxide formed between the Ge substrate and the dielectric layer. The method includes causing a supercritical fluid composition that includes a supercritical carbon dioxide fluid and an oxidant to diffuse into the germanium suboxide between the Ge substrate and the dielectric layer of the Ge semiconductor element.

The dielectric layer is formed by virtue of depositing a material having high dielectric constant, such as hafnium dioxide ($HfO_2$), zirconium dioxide ($ZrO_2$) or lanthanum oxide (LaO), on a surface of the Ge substrate under a relatively high temperature. During deposition of the dielectric layer, some metal will remain in the dielectric layer and is hereinafter referred to as "metal residues". $GeO_x$ and germanium oxide ($GeO_2$) are native oxides of the Ge substrate and are formed between the Ge substrate and the dielectric layer during depositing the dielectric layer or during other subsequent thermal processes. In this embodiment, zirconium dioxide is used as the dielectric layer for illustration.

Specifically, in this invention, the Ge semiconductor element including the Ge substrate and the dielectric layer is formed by depositing the $ZrO_2$ dielectric layer using a radio frequency (RF) sputtering method on a 100 surface of a Ge wafer that is rinsed by virtue of an RCA standard process, and annealing the Ge substrate and the dielectric layer in a vacuum furnace tube under a pressure of $5*10^{-6}$ Torr and a temperature of 250° C., followed by a rapid thermal annealing (RTA) process under a temperature between 400° C.~500° C. for one minute for simulating a thermal process that is conducted on a common semiconductor element in subsequent processes. The Ge semiconductor element of the preferred embodiment according to this invention is thus manufactured.

Referring to FIG. 1, the preferred embodiment of the method for removing $GeO_x$ (x<2) according to this invention comprises steps A and B.

In step A, the supercritical fluid composition including the supercritical carbon dioxide ($scCO_2$) fluid, the oxidant and a solubilizer is prepared.

The $scCO_2$ fluid is under a temperature higher than 30° C. and a pressure not smaller than 1170 psi. The oxidant is selected from the group consisting of high pressure water vapor, hydrogen peroxide and the combination thereof. The volume percentage of the oxidant is not larger than 10% more preferably not higher than 5% based on the volume of $scCO_2$.

In addition, because $CO_2$ is non-polar and the oxidant (i.e., high pressure water vapor and/or hydrogen peroxide) is polar, the solubilizer is thus added to the supercritical fluid composition with a volume percentage not larger than 10% based on the volume of $scCO_2$ for increasing the solubility of the oxidant in the $scCO_2$. Preferably, the volume percentage of the solubilizer is not larger than 5% based on the volume of $scCO_2$.

Preferably, the solubilizer is an alcohol such as methanol, ethanol, propan-1-ol, propan-2-ol or combinations thereof, and the volume ratio of the solubilizer to the oxidant is between 0.5 to 2; more preferably, the volume ratio is between 0.5 to 1. In a preferred embodiment of this invention, the supercritical fluid composition includes $scCO_2$, 5 volume % of high pressure water vapor based on the volume of $scCO_2$, and 5 volume % of propanol based on the volume of $scCO_2$.

Specifically, the supercritical fluid composition of this invention is prepared by heating and pressurizing $CO_2$ to a supercritical condition of a temperature higher than 30° C. and a pressure not smaller than 1170 psi, and then mixing 5 volume % of high pressure water vapor, and 5 volume % of propanol with the supercritical $CO_2$.

In this invention, removal of the Ge suboxide can be achieved at a temperature not higher than 200° C. That is, the supercritical fluid composition is at a temperature not higher than 200° C. Preferably, the supercritical fluid composition has a temperature ranging between 100° C. and 200° C.

Preferably, to accomplish better compatibility between the oxidant and the $scCO_2$ fluid to promote the transportability and the reaction efficiency of the oxidant in $scCO_2$, the supercritical fluid composition has a pressure between 1175 psi and 3500 psi, and the time for the redox reaction is not shorter than 30 minutes.

For explanation of the mechanism of the redox reaction among the metal residues in the dielectric layer, the germanium suboxide and the oxidant, water is used as the oxidant, GeO is used as an example for the germanium suboxide and $ZrO_2$ is used as the dielectric layer in the following reaction schemes. The oxidant (water) first reacts with Zr metal residues in the dielectric layer so as to oxidize Zr into $ZrO_2$ and to form a reducing agent (e.g., hydrogen). The reducing agent further reacts with GeO to reduce GeO to germanium (see following schemes). By this way, $GeO_x$ (x<2) formed between the Ge substrate and the dielectric layer can be removed.

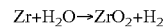

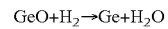

Although water has strong oxidizing power under a high pressure environment, the critical point condition thereof (i.e., a critical temperature of 374° C. and a critical pressure of 3209 psi) is too high to be achieved. Therefore, in this invention, the scCO$_2$ fluid is used as a carrier for transporting high pressure water vapor to enable the high pressure water vapor having a strong oxidizing power to diffuse into an interface between the dielectric layer and the Ge substrate at a relatively low temperature (i.e., <200° C.) and remove the GeOx by virtue of the redox reaction. Because the supercritical fluid composition has characteristics similar to gas, the supercritical fluid composition has a relatively high diffusion coefficient and low surface tension, and is able to diffuse into a microstructure without causing any structural damage. Therefore, the supercritical fluid composition can be diffuse into the GeO$_x$ layer which has a loose structure. The supercritical fluid composition also has the characteristic of fluid and thus exhibits relatively high solubility and transportability such that GeO$_x$ formed on the interface between the dielectric layer and the Ge substrate can be effectively removed. Moreover, GeO$_x$ formed in the subsequent thermal process (>500° C.) can be removed and deterioration of the interface between the dielectric layer and the Ge substrate can be improved by virtue of the supercritical fluid composition. The electrical defect resulting from diffusion of Ge into the dielectric layer can be alleviated. Therefore, a gate-first process of a common poly-silicon transistor could be applied to the process for making a Ge transistor element.

Figure 3:
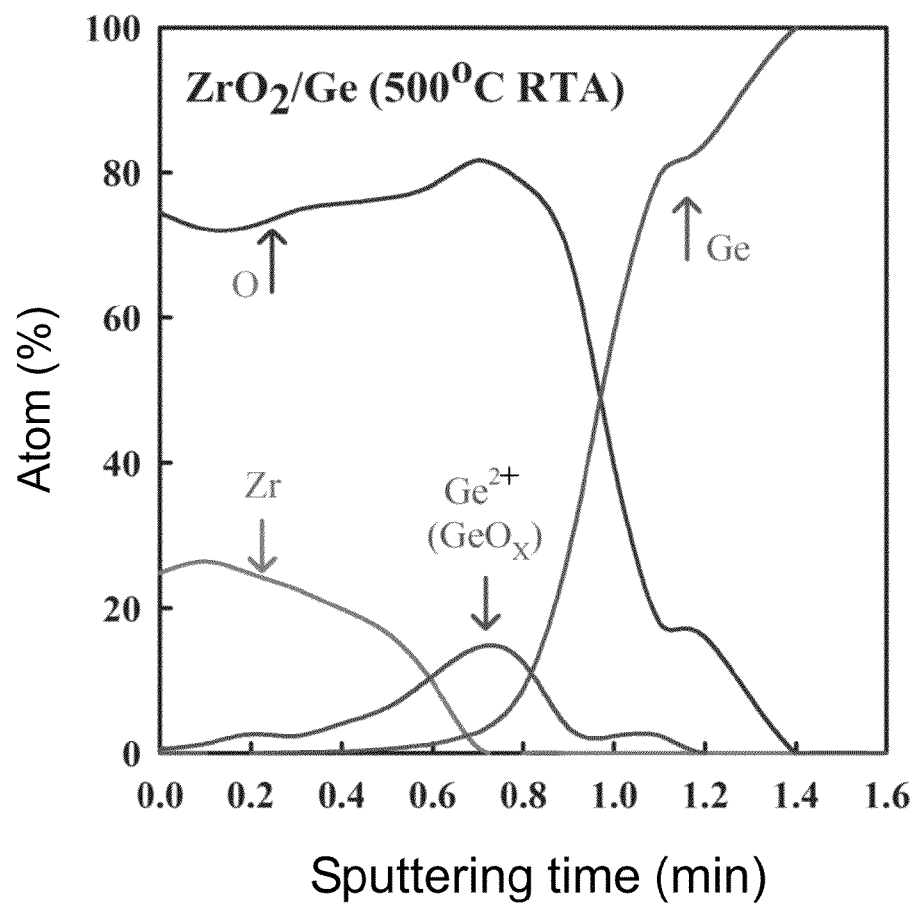
FIG. 3 shows composition-depth profiling analysis of the Ge semiconductor element to be processed by the method of the preferred embodiment.

FIG. 2 is a transmission electron microscope (TEM) picture of the Ge semiconductor element to be processed by the method of the preferred embodiment. FIG. 3 is a composition-depth profiling analysis diagram of the Ge semiconductor element shown in FIG. 2.

From FIG. 2, it can be seen that the thickness of the ZrO$_2$ dielectric layer of the Ge semiconductor element is 5.3 nm, and a layer of germanium suboxide having a thickness of 2.9 nm exists between the Ge substrate and the dielectric layer (ZrO$_2$). From the XPS depth profile in FIG. 3, it is revealed that the layer of germanium suboxide exists between Ge and ZrO$_2$. Moreover, from FIGS. 2 and 3, GeO$_x$ also diffuses into the dielectric layer of zirconium dioxide.

Figure 4:
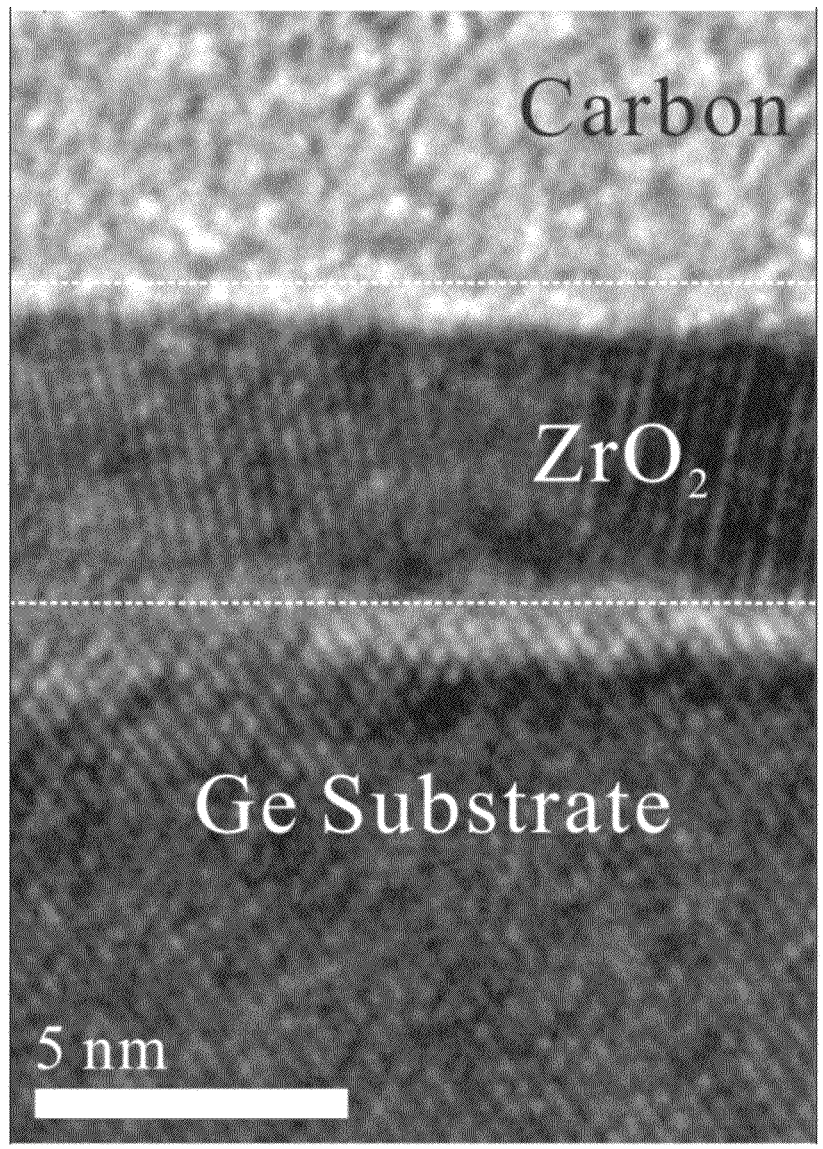
FIG. 4 is a TEM diagram showing the Ge semiconductor element processed by the method of the preferred embodiment.
Figure 5:
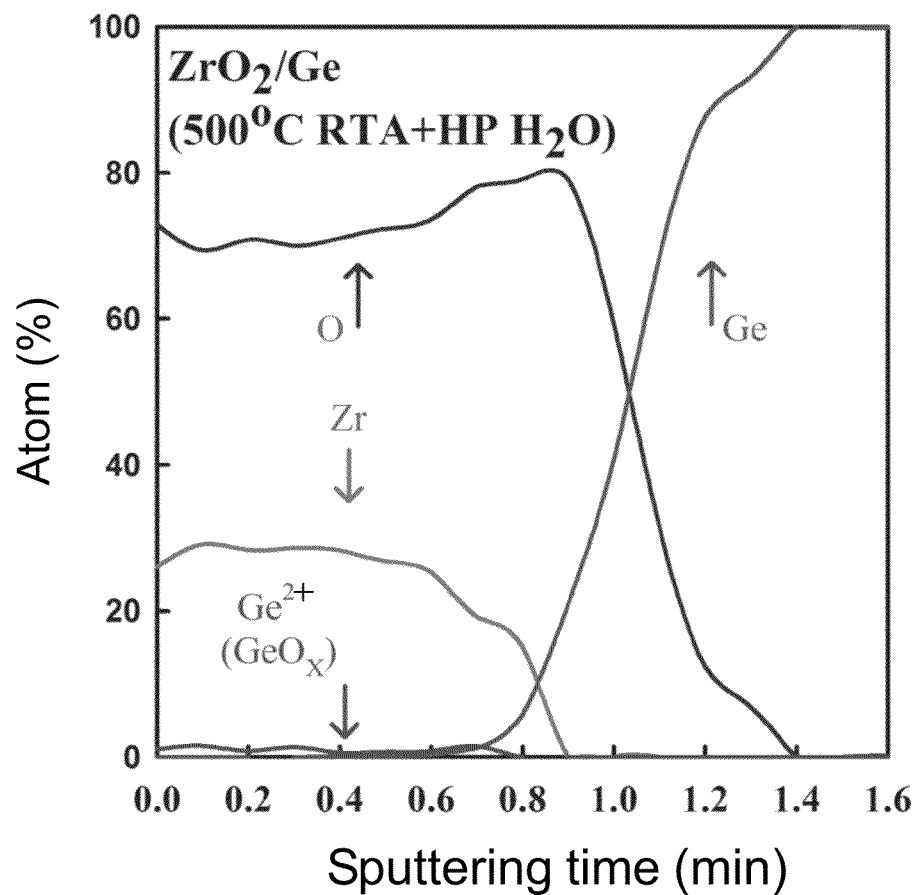
FIG. 5 shows composition-depth profiling analysis of the Ge semiconductor element processed by the method of the preferred embodiment.

FIGS. 4 and 5 are respectively a TEM picture and the composition-depth profiling analysis diagram of the Ge semiconductor element processed by the method of the preferred embodiment according to this invention.

From FIG. 4, it can be seen that the germanium suboxide (GeO$_x$, x<2) between the Ge substrate and the ZrO$_2$ dielectric layer disappears after being processed by the method of the preferred embodiment. From the XPS depth profile shown in FIG. 5, the germanium suboxide (GeO$_x$, x<2) between the Ge substrate and the ZrO$_2$ dielectric layer has obviously disappeared, and the content of the germanium suboxide (GeO$_x$, x<2) in the ZrO$_2$ dielectric layer is also reduced as compared to FIG. 2.

Figure 6:
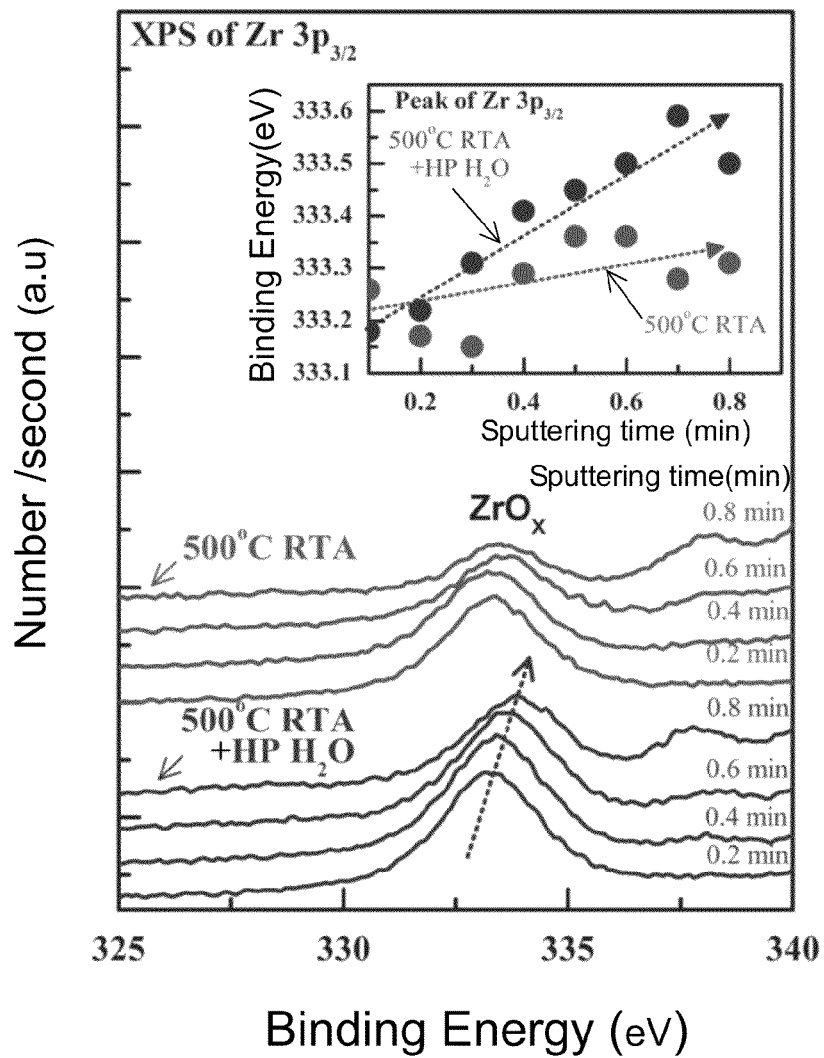
FIG. 6 is XPS spectra of Zr of the Ge semiconductor element processed by RTA and processed by RTA and the method of this invention, and the inset shows peak evolution of Zr $3p_{3/2}$ signal with sputtering time.

FIG. 6 shows XPS spectra of Zr, in which the curves indicated by "500° C. RTA" corresponding to the profile for the Ge semiconductor element that is processed by RTA only (i.e., without processing by the method of this invention) and the curves indicated by "500° C. RTA+HP H$_2$O" corresponding to the profile for the Ge semiconductor element that is processed by RTA and the method of this invention. The inset in FIG. 6 shows the relationship between the binding-energy and the sputtering time. From FIG. 6, it can be seen that the binding-energy peak for Zr 3p$_{3/2}$ of ZrO$_2$ is about 333.2 eV. After processing by the method of this invention, the binding-energy peak for Zr 3p$_{3/2}$ of ZrO$_2$ shifts to the high energy direction with the increase in the thickness of the dielectric layer, which indicates that the dielectric layer is further oxidized by the supercritical fluid composition and that the oxidation is prone to occur at the Ge/ZrO$_2$ interface.

Figure 7:
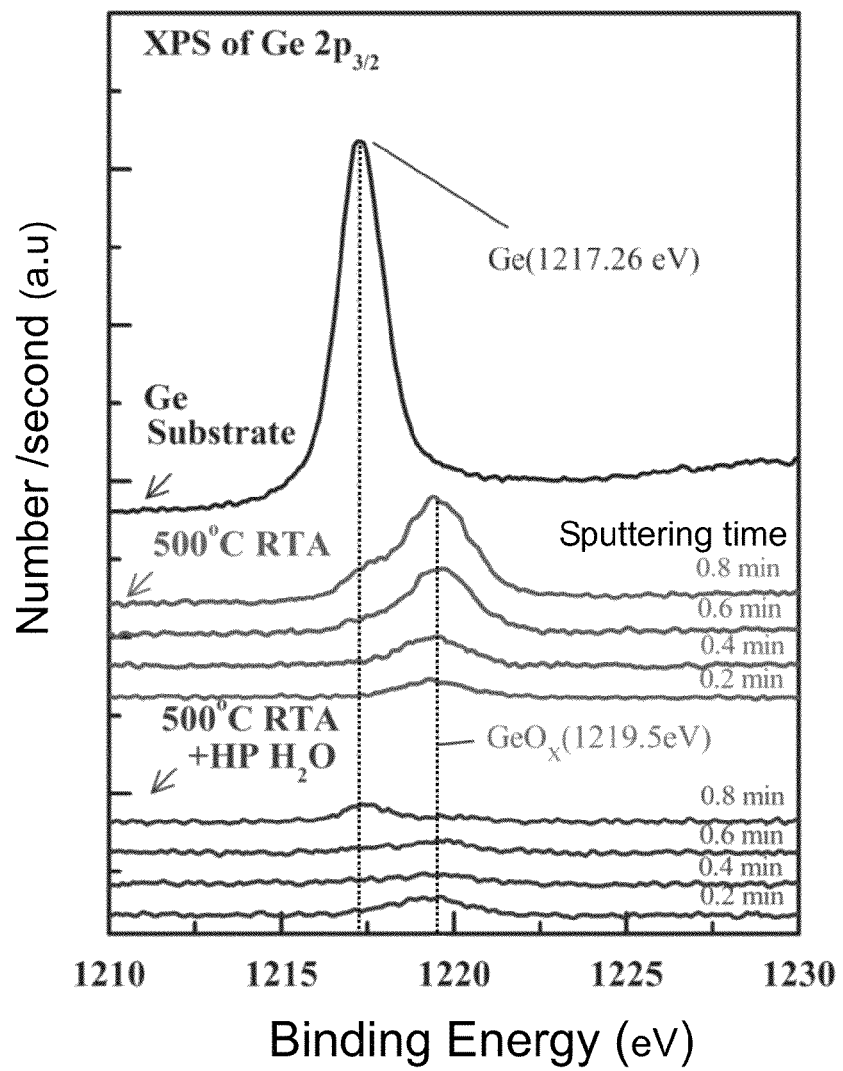
FIG. 7 is XPS spectra of Ge of the Ge semiconductor element processed by RTA only and processed by RTA and the method of this invention.

From FIG. 7, it is revealed that the binding-energy peaks for Ge 3p$_{3/2}$ of Ge and germanium suboxides are respectively 1217.26 eV and 1219.5 eV. After RTA processing, GeO$_x$ occurs at the interface between Ge and the dielectric layer. However, after processing by the method of this invention, GeO$_x$ formed after RTA processing can be effectively removed. That is, GeO$_x$ formed in the depositing process of the dielectric layer or the subsequent thermal process can be effectively removed by the method of this invention using the supercritical fluid composition.

Figure 8:
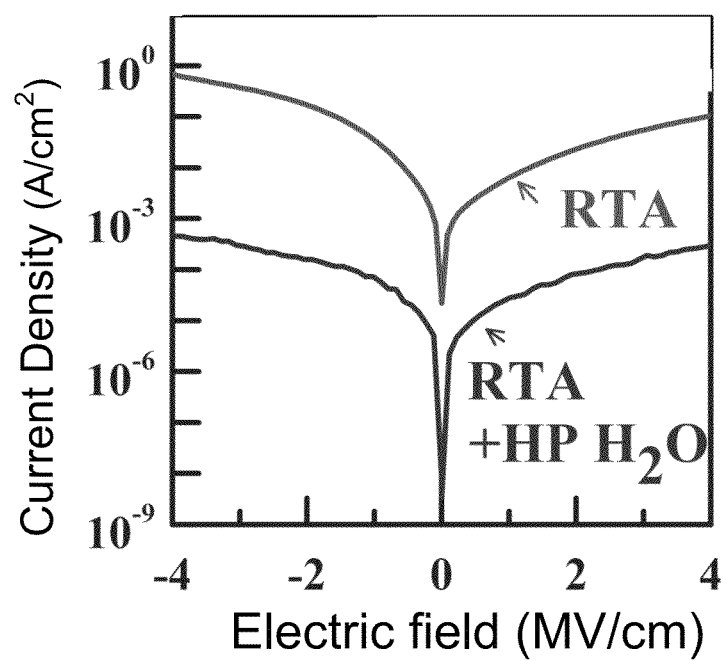
FIG. 8 is a diagram illustrating variations in current density of the Ge-MOSFET including the Ge semiconductor element processed by RTA only and current density of the Ge-MOSFET including the Ge semiconductor element processed by RTA and the method of this invention.

FIG. 8 shows the results of gate leakage current of a MOS capacitor structure containing the Ge semiconductor element that is processed by RTA only (the curve of RTA) or processed by RTA and the method of this invention (the curve indicated by "RTA+HP H$_2$O"). Since the manufacturing method of the MOS capacitor structure is well-known in the technical field, a detailed description thereof is omitted herein for the sake of brevity.

From FIG. 8, it is shown that, after being processed by the method of this invention, the gate leakage current of the MOS capacitor can be effectively reduced.

To sum up, by virtue of the supercritical fluid composition including the oxidant and the scCO$_2$ as a carrier, GeO$_x$ formed between the Ge substrate and the dielectric layer made of metal oxide can be effectively removed through a redox reaction among the metal residues in the dielectric layer, the oxidant and GeO$_x$, thereby reducing gate leakage current of a Ge semiconductor element.

While the present invention has been described in connection with what are considered the most practical and preferred embodiments, it is understood that this invention is not limited to the disclosed embodiments but is intended to cover various arrangements included within the spirit and scope of the broadest interpretations and equivalent arrangements.

What is claimed is:

1. A method for removing germanium suboxide between a germanium (Ge) substrate and a dielectric layer made of metal oxide, comprising causing a supercritical fluid composition that includes a supercritical carbon dioxide (scC0$_2$) fluid and an oxidant to diffuse into the germanium suboxide such that metal residues in the dielectric layer, the germanium suboxide and the oxidant are subjected to a redox reaction so as to reduce the germanium suboxide into germanium.

2. The method of claim 1, wherein the redox reaction among the metal residues in the dielectric layer, the germanium suboxide and the oxidant includes oxidizing the metal residues through the oxidant to generate a reducing agent, followed by reducing germaniumsuboxide into germanium through the reducing agent.

3. The method of claim 1, wherein the oxidant has a volume not greater than 10% based on the volume of scC0$_2$.

4. The method of claim 1, wherein the supercritical fluid composition is at a temperature not higher than 200° c.

5. The method of claim 4, wherein the supercritical fluid composition is at a temperature ranging from 100° c. to 200° C.

6. The method of claim 1, wherein the oxidant is selected from the group consisting of water vapor, hydrogen peroxide and a combination thereof.

7. The method of claim 1, wherein the supercritical fluid composition further includes a solubilizer for increasing solubility of the oxidant in the supercritical carbon dioxide fluid, the volume of the solubilizer being not greater than 10% based on the volume of scC0$_2$.

8. The method of claim 7, wherein the volume ratio of the solubilizer to the oxidant is between 0.5 and 2.

9. The method of claim 7, wherein the solubilizer is selected from the group consisting of methanol, ethanol, propan-1-ol, propan-2-ol and combinations thereof.

10. The method of claim 1, wherein the pressure of the supercritical fluid composition is between 1170 psi and 3500 psi.

11. The method of claim 1, wherein the supercritical fluid composition consists of the supercritical carbon dioxide fluid, the oxidant, and a solubilizer.

* * * * *